(12) United States Patent
Kang et al.

(10) Patent No.: US 12,431,177 B2
(45) Date of Patent: Sep. 30, 2025

(54) MEMORY DEVICE, MEMORY MODULE, AND OPERATING METHOD OF MEMORY DEVICE FOR PROCESSING IN MEMORY

(71) Applicant: SAMSUNG ELECTRONICS CO., LTD., Suwon-si (KR)

(72) Inventors: Shinhaeng Kang, Suwon-si (KR); Kyomin Sohn, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 240 days.

(21) Appl. No.: 18/070,741

(22) Filed: Nov. 29, 2022

(65) Prior Publication Data

US 2023/0223065 A1 Jul. 13, 2023

(30) Foreign Application Priority Data

Jan. 13, 2022 (KR) .......................... 10-2022-0004964
May 31, 2022 (KR) .......................... 10-2022-0066650

(51) Int. Cl.
*G11C 11/22* (2006.01)
(52) U.S. Cl.
CPC ...... *G11C 11/2257* (2013.01); *G11C 11/2275* (2013.01)
(58) Field of Classification Search
CPC .................. G11C 11/2257; G11C 11/2275
USPC ........................................................ 365/145
See application file for complete search history.

(56) References Cited

U.S. PATENT DOCUMENTS

| | | | |
|---|---|---|---|
| 8,200,950 B2 | 6/2012 | Okabe | |
| 10,437,482 B2 | 10/2019 | Chang et al. | |
| 11,152,053 B2* | 10/2021 | Kwon | G11C 11/4087 |
| 11,188,406 B1* | 11/2021 | Alsop | G06F 11/0778 |
| 2015/0100734 A1 | 4/2015 | Abdallah | |
| 2019/0205244 A1* | 7/2019 | Smith | G06F 3/065 |
| 2020/0293319 A1 | 9/2020 | Lee et al. | |
| 2021/0019147 A1 | 1/2021 | Studer et al. | |
| 2021/0208801 A1 | 7/2021 | Song | |

FOREIGN PATENT DOCUMENTS

| | | |
|---|---|---|
| KR | 10-1804027 B1 | 12/2017 |
| KR | 10-1867219 B1 | 6/2018 |
| KR | 10-2265600 B1 | 6/2021 |

* cited by examiner

*Primary Examiner* — Alexander Sofocleous
*Assistant Examiner* — Tracy Hampton
(74) *Attorney, Agent, or Firm* — Wolf, Greenfield & Sacks, P.C.

(57) ABSTRACT

Disclosed is a memory device which includes a plurality of memory banks and control logic. The control logic receives a plurality of column address bits and a plurality of read commands. The control logic includes a processing-in-memory (PIM) address generator. In a first operation mode, the control logic sends the plurality of column address bits to a memory bank. In a second operation mode, when the PIM address generator receives a first read command of the plurality of read commands, the control logic sends, to the memory bank, a first PIM address generated based on remaining column address bits other than some column address bits of the plurality of column address bits.

20 Claims, 10 Drawing Sheets

MEMORY DEVICE, MEMORY MODULE, AND OPERATING METHOD OF MEMORY DEVICE FOR PROCESSING IN MEMORY

CROSS-REFERENCE TO RELATED APPLICATIONS

This application claims priority under 35 U.S.C. § 119 to Korean Patent Application Nos. 10-2022-0004964 filed on Jan. 13, 2022, and 10-2022-0066650 filed on May 31, 2022, in the Korean Intellectual Property Office, the disclosures of which are incorporated by reference herein in their entireties.

BACKGROUND

1. Field

Embodiments relate to a semiconductor device, and more particularly, relate to a memory device performing in-memory processing, a memory module including the same, and an operating method of the memory device.

2. Description of the Related Art

A random access memory may directly perform some of calculations of a central processing unit, which is called processing-in-memory (PIM). Because the random access memory directly performs some calculations, communications between a central processing unit and the random access memory may decrease, and a bottleneck may be eliminated.

SUMMARY

An embodiment is directed to a memory device that includes a plurality of memory banks. Each of the plurality of memory banks includes a memory cell array that includes a plurality of memory cells connected with a plurality of word lines, a row decoder that is connected with the memory cell array through the plurality of word lines, a sense amplifier and write driver that is connected with the memory cell array through a plurality of bit lines, a column decoder that is connected with the sense amplifier and write driver, and control logic that receives a plurality of column address bits and a plurality of read commands. The control logic includes a processing-in-memory (PIM) address generator. In a first operation mode, the control logic sends the plurality of column address bits to a memory bank. In a second operation mode, when the PIM address generator receives a first read command of the plurality of read commands, the control logic sends, to the memory bank, a first PIM address generated based on remaining column address bits other than some column address bits of the plurality of column address bits.

An embodiment is directed to an operating method of a memory device for a PIM calculation, which includes a plurality of memory banks each including a plurality of memory cells includes receiving, at control logic, a plurality of column address bits and a plurality of read commands from a memory controller, sending, at the control logic, the plurality of column address bits to a memory bank in a first operation mode, and when a PIM address generator receives a first read command of the plurality of read commands, sending, at the control logic, to the memory bank, a first PIM address generated based on remaining column address bits other than some column address bits of the plurality of column address bits in a second operation mode.

An embodiment is directed to a memory module that includes a plurality of memory devices. The plurality of memory devices receive a command and an address from an external host through a memory controller. Each of the plurality of memory devices includes a plurality of memory banks, each of which includes a memory cell array including a plurality of memory cells connected with a plurality of word lines, a row decoder connected with the memory cell array through the plurality of word lines, a sense amplifier and write driver connected with the memory cell array through a plurality of bit lines, a column decoder connected with the sense amplifier and write driver, and control logic receiving a plurality of column address bits and a plurality of read commands. The control logic further includes a processing-in-memory (PIM) address generator. In a first operation mode, the control logic sends the plurality of column address bits to a memory bank. In a second operation mode, when the PIM address generator receives a first read command of the plurality of read commands, the control logic sends, to the memory bank, a first PIM address generated based on remaining column address bits other than some column address bits of the plurality of column address bits.

BRIEF DESCRIPTION OF THE DRAWINGS

Features will become apparent to those of skill in the art by describing in detail example embodiments with reference to the attached drawings in which.

DETAILED DESCRIPTION

Figure 1:
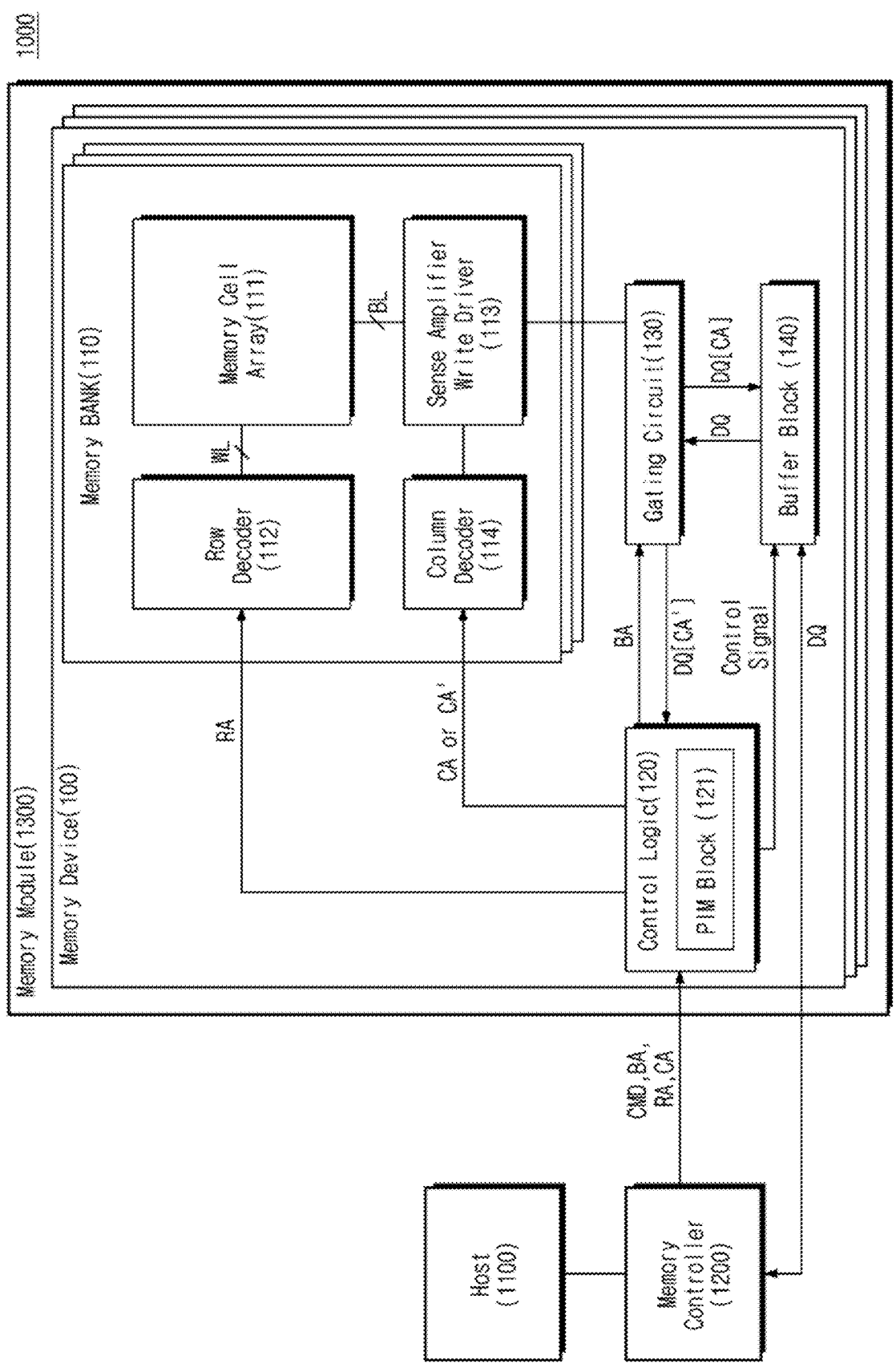
FIG. 1 is a block diagram illustrating an electronic device according to an example embodiment.

FIG. 1 is a block diagram illustrating an electronic device 1000 according to an example embodiment.

Referring to FIG. 1, the electronic device 1000 for processing-in-memory (PIM) calculation may include a host 1100, a memory controller 1200, and a memory module 1300.

The memory module 1300 may include a plurality of memory devices 100. However, in the specification, one memory device 100 of the plurality of memory devices included in the memory module 1300 will be described. Configurations and functions of the remaining memory devices may be the same as a configuration and a function of the memory device 100 to be described below.

The memory device 100 may be a dynamic random access memory (DRAM), or the memory device 100 may be one of various random access memories such as s static random access memory (SRAM), a magnetic RAM (MRAM), a phase-change RAM (PRAM), a ferroelectric RAM (FRAM), and a resistive RAM (RRAM).

The host 1100 may send a command CMD and addresses BA, RA, and CA to the memory device 100 through the memory controller 1200. An example in which the memory controller 1200 is provided outside the host 1100 is illustrated, but the memory controller 1200 may be included in the host 1100.

When the host 1100 performs a write operation for writing data in the memory device 100, the host 1100 may send a data signal DQ to the memory device 100 through the memory controller 1200 together with the command CMD and the addresses BA, RA, and CA. The memory device 100 may write data in corresponding memory cells based on the command CMD and the addresses BA, RA, and CA.

When the host 1100 performs a read operation for reading data from the memory device 100, the host 1100 may send the command CMD and the addresses BA, RA, and CA to the memory device 100 through the memory controller 1200. The memory device 100 may read data from corresponding memory cells based on the command CMD and the addresses BA, RA, and CA, and may send the read data as the data signal DQ to the host 1100 through the memory controller 1200.

The memory device 100 may include a plurality of memory banks 110 each including a memory cell array 111, a row decoder 112, a sense amplifier and write driver 113, and a column decoder 114, control logic 120 including a PIM block 121, a gating circuit 130, and a buffer block 140.

Each of the plurality of memory banks 110 may include a plurality of memory cells connected with a plurality of word lines WLs. Each of the plurality of word lines WLs may be connected with a plurality of memory cells.

The memory cell array 111 may include the plurality of memory cells (not illustrated) arranged in a row direction and a column direction. Each of the plurality of memory cells may be connected with one of the plurality of word lines WLs and one of a plurality of bit lines BLs.

The row decoder 112 may operate under control of the control logic 120. The row decoder 112 may enable one or more word lines selected as an access target from among the plurality of word lines WLs. The row decoder 112 may select one or more word lines of the plurality of word lines WLs as an access target, based on the row address RA received from the memory controller 1200.

The sense amplifier and write driver 113 may operate under control of the control logic 120. The sense amplifier and write driver 113 may be connected with the plurality of memory cells through the plurality of bit lines BLs.

The column decoder 114 may operate under control of the control logic 120. The column decoder 114 may be connected with the sense amplifier and write driver 113. The column decoder 114 may electrically connect the gating circuit 130 with the sense amplifier and write driver 113 connected with one or more bit lines selected from the plurality of bit lines BLs. The column decoder 114 may select one or more bit lines of the plurality of bit lines BLs based on the column address CA received from the memory controller 1200.

The control logic 120 may include the PIM block 121. The PIM block 121 may be disabled when there is no PIM instruction set. In this case, the control logic 120 may allow the memory device 100 to operate in a first operation mode.

When the PIM instruction set is present in the PIM block 121, the control logic 120 may allow the memory device 100 to operate in a second operation mode for performing the PIM calculation.

The first operation mode and the second operation mode will be described in detail below.

The control logic 120 may control operations of the components of the memory device 100. The control logic 120 may receive the command CMD and the addresses BA, RA, and CA from the memory controller 1200.

In the first operation mode, the control logic 120 may control the components of the memory device 100 such that an operation requested by the command CMD is performed on memory cells indicated by the bank address BA, the row address RA, and the column address CA.

In the second operation mode, the control logic 120 may generate a new column address (hereinafter referred to as a PIM address CA') irrelevant to at least some of address bits of the column address CA received from the memory controller 1200. In the second operation mode, the control logic 120 may control the components of the memory device 100 such that an operation requested by the command CMD is performed on memory cells indicated by the bank address BA, the row address RA, and the PIM address CA'.

The gating circuit 130 may operate under control of the control logic 120. The gating circuit 130 may connect the buffer block 140 with a memory bank indicated by the bank address BA from among the plurality of memory banks 110.

When the memory device 100 performs the data write operation on memory cells in the first operation mode, the gating circuit 130 may receive the data signal DQ that the buffer block 140 receives from the memory controller 1200.

When the memory device 100 performs the data read operation on memory cells in the first operation mode, the gating circuit 130 may provide the buffer block 140 with data DQ[CA] read from memory cells of a memory bank accessed through the command CMD and the addresses BA, RA, and CA.

When the memory device 100 operates in the second operation mode, the gating circuit 130 may provide the control logic 120 with data DQ[CA'] read from memory cells of a memory bank accessed through the command CMD and the addresses BA, RA, and CA.

The buffer block 140 may operate under control of the control logic 120. In the first operation mode, the control logic 120 may control the buffer block 140 based on a control signal such that the buffer block 140 exchanges the data signal DQ with the memory controller 1200.

When the memory device 100 performs the data read operation on memory cells in the first operation mode, the control logic 120 may control the buffer block 140 such that the buffer block 140 outputs the read data to the memory device 100.

Figure 2:
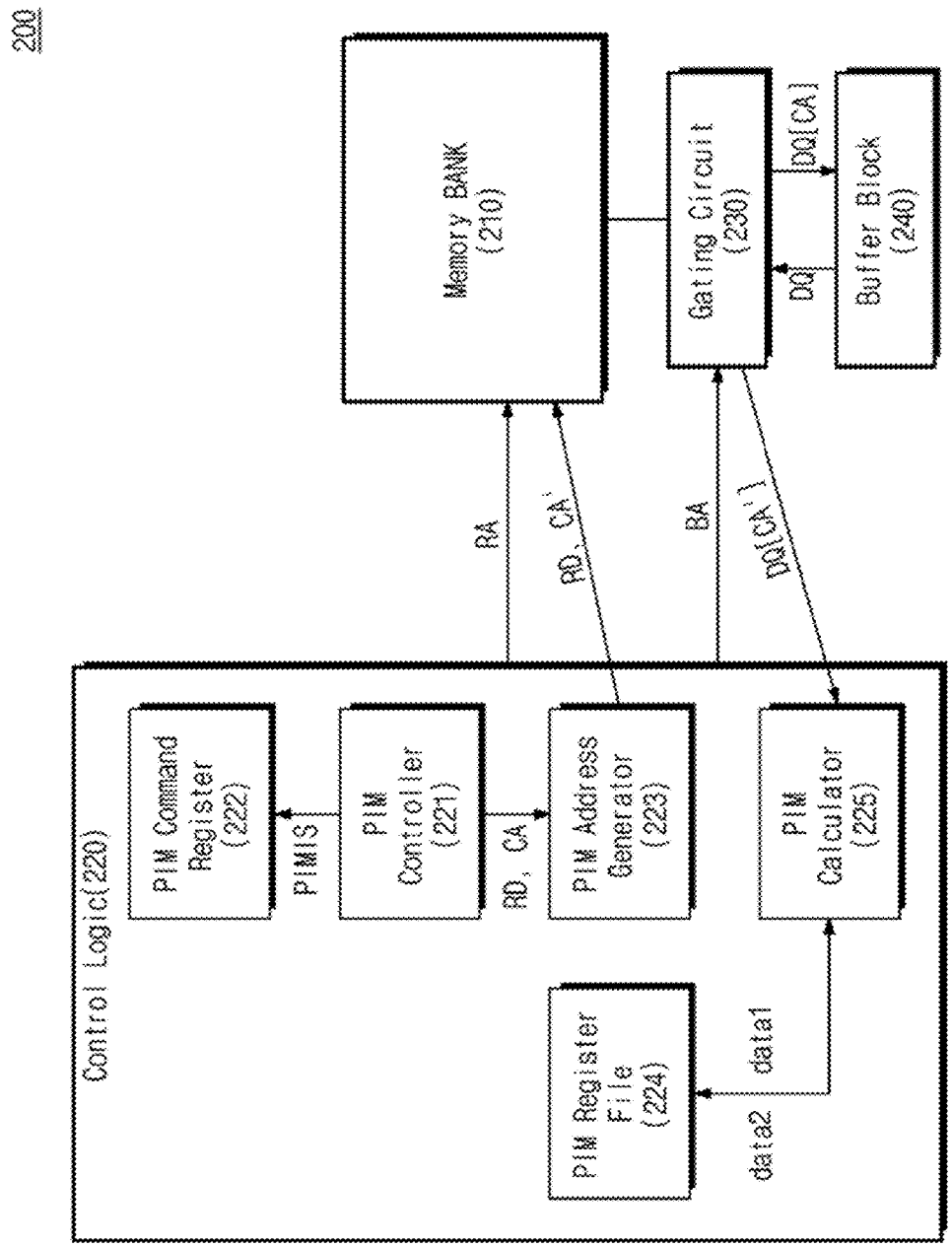
FIG. 2 is a diagram illustrating a detailed configuration of control logic performing a PIM function in a memory device.

FIG. 2 is a diagram illustrating a detailed configuration of control logic 220 performing a PIM function in a memory device 200.

In an example embodiment, a plurality of memory banks 210, a gating circuit 230, and a buffer block 240 included in the memory device 200 of FIG. 2 respectively correspond to the plurality of memory banks 110, the gating circuit 130, and the buffer block 140 included in the memory device 100 of FIG. 1, and thus, additional description will be omitted to avoid redundancy.

The control logic 220 may include a PIM controller 221, a PIM command register 222, a PIM address generator 223, a PIM register file 224, and a PIM calculator 225.

Referring to FIGS. 1 and 2, the PIM controller 221 may receive a PIM instruction set PIMIS from the memory controller 1200 through at least one of various setting instructions defined by a standard.

The PIM controller 221 may receive the PIM instruction set PIMIS and may store the PIM instruction set PIMIS in the PIM command register 222. Depending on whether the PIM instruction set PIMIS is present in the PIM command register 222, the control logic 120/220 may allow the memory device 100/200 to operate in the first operation mode or the second operation mode.

When the PIM instruction set PIMIS is absent from the PIM command register 222, the PIM controller 221 may be disabled (i.e., the control logic 120/220 may allow the memory device 100/200 to operate in the first operation mode); when the PIM instruction set PIMIS is present in the PIM command register 222, the PIM controller 221 may be enabled (i.e., the control logic 120/220 may allow the memory device 100/200 to operate in the second operation mode for performing the PIM calculation).

The PIM controller 221 may receive the command CMD and the column address CA from the memory controller 1200. The command CMD may be at least one of a read command RD, a write command WR, an active command ACT, and a precharge command PRE. Below, the PIM controller 221 may operate in response to the read command RD.

The PIM controller 221 may be disabled in the first operation mode. In the first operation mode, the memory device 100/200 may read the data DQ[CA] of the memory cells of the memory bank selected based on the read command RD and the column address CA that the control logic 120/220 receives.

In the second operation mode, the memory device 100/200 may read the data DQ[CA'] of the memory cells of the memory bank selected based on the read command RD and the column address CA that the control logic 120/220 receives. A relationship between the column address CA and the memory cells of the selected memory bank in which the data DQ[CA'] are stored will be described in detail below.

In FIG. 2, data1 may refer to data before the PIM calculation, and data2 may refer to data after the PIM calculation. Alternatively, data1 may refer to data after the PIM calculation, and data2 may refer to data before the PIM calculation. Below, the description will be given under the condition that data1 refer to data before the PIM calculation and data2 refer to data after the PIM calculation.

The PIM controller 221 may perform the PIM calculation in the second operation mode. In the second operation mode, the control logic 120/220 may allow the PIM calculator 225 to perform the PIM calculation based on the data DQ[CA'] of the memory cells of the selected memory bank and the data1 of a plurality of registers in the PIM register file 224. A configuration of the PIM calculator 225 performing the PIM calculation will be described in detail below.

The PIM command register 222 may store the PIM instruction set PIMIS that the PIM controller 221 receives. The PIM instruction set PIMIS may include information about an operator, registers of the PIM register file 224, and a burst length BL. The information included in the PIM instruction set PIMIS will be described in detail below.

The PIM address generator 223 may operate under control of the control logic 120/220. The PIM address generator 223 may be disabled in the first operation mode.

The control logic 120/220 may execute a PIM command in the second operation mode. The PIM command may include a plurality of read commands RD received from the memory controller 1200. However, the PIM command may include a command that directs to perform the PIM calculation in addition to operations indicated by the plurality of read commands RD and directs to store a result data2 of the PIM calculation in the plurality of registers of the PIM register file 224.

Below, in the second operation mode, the PIM controller 221 may receive the plurality of read commands RD included in the PIM command from the memory controller 1200. In the second operation mode, the PIM controller 221 may provide the PIM address generator 223 with the plurality of read commands RD and the column addresses CA.

The PIM address generator 223 may generate one PIM address whenever one of the plurality of read commands RD and one of the plurality of column addresses CA are received.

For example, the PIM address generator 223 may provide the plurality of memory banks 210 with one PIM address that is generated regardless of at least some of column address bits of one column address.

As such, the PIM address generator 223 may generate the plurality of PIM addresses CA' and may provide the plurality of PIM addresses CA' to the plurality of memory banks 210. A configuration of the PIM address generator 223 generating the plurality of PIM addresses CA' will be described in detail below.

The PIM register file 224 may include a plurality of registers. The plurality of registers may be configured to store the plurality of data data1 and data2.

The PIM calculator 225 may operate under control of the control logic 120/220. In the second operation mode, the control logic 120/220 may provide the PIM calculator 225 with the data data1 of the plurality of registers corresponding to each of the plurality of PIM addresses CA' and the data DQ[CA'] of the memory cells of the selected memory bank corresponding to each of the plurality of PIM addresses CA'.

In the second operation mode, the PIM calculator 225 may perform the PIM calculation based on the data data1 of the plurality of registers corresponding to each of the plurality of PIM addresses CA' and the data DQ[CA'] of the memory cells of the selected memory bank corresponding to each of the plurality of PIM addresses CA'.

As an example, the PIM calculation may be a multiplication and accumulation (MAC) operation. A configuration performing the PIM calculation will be described in detail below.

Figure 3:
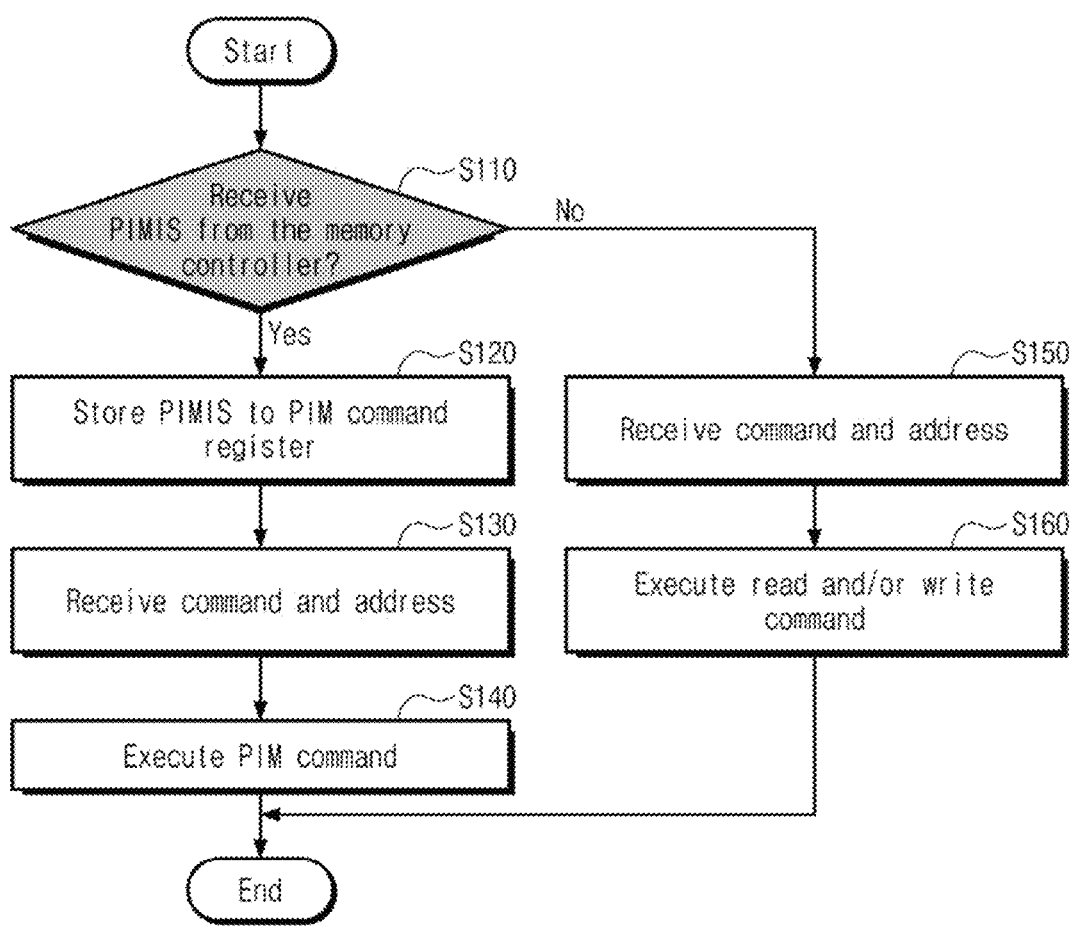
FIG. 3 is a flowchart illustrating how to determine a command that control logic executes.

FIG. 3 is a flowchart illustrating how to determine a command that the control logic 120 or 220 executes.

Referring to FIGS. 1 to 3, in operation S110, PIM controller 221 may receive the PIM instruction set PIMIS from the memory controller 1200. When the PIM controller 221 does not receive the PIM instruction set PIMIS in operation S110, operation S150 and operation S160 that correspond to the first operation mode may be performed.

In operation S150, the control logic 120/220 may receive the command CMD and the addresses BA, RA, and CA from the memory controller 1200.

In operation S160, the control logic 120/220 may execute the data read and/or data write command.

When the PIM controller 221 receives the PIM instruction set PIMIS in operation S110, operation S120 to operation S140 that correspond to the second operation mode for performing the PIM calculation may be performed.

In operation S120, the PIM command register 222 may store the PIM instruction set PIMIS that the PIM controller 221 receives.

In operation S130, the control logic 120/220 may receive the plurality of read commands RD and the plurality of column addresses CA from the memory controller 1200. Also, the PIM controller 221 may receive the plurality of read commands RD and the plurality of column addresses CA from the memory controller 1200.

In operation S140, the control logic 120/220 may execute the PIM command. The PIM command may refer to a command for reading the data DQ[CA'] of memory cells of a memory bank and the data data1 of the plurality of registers of the PIM register file 224 and performing the PIM calculation. Also, the PIM command may refer to a command for writing the result data2 of the PIM calculation in the plurality of registers of the PIM register file 224.

Figure 4:
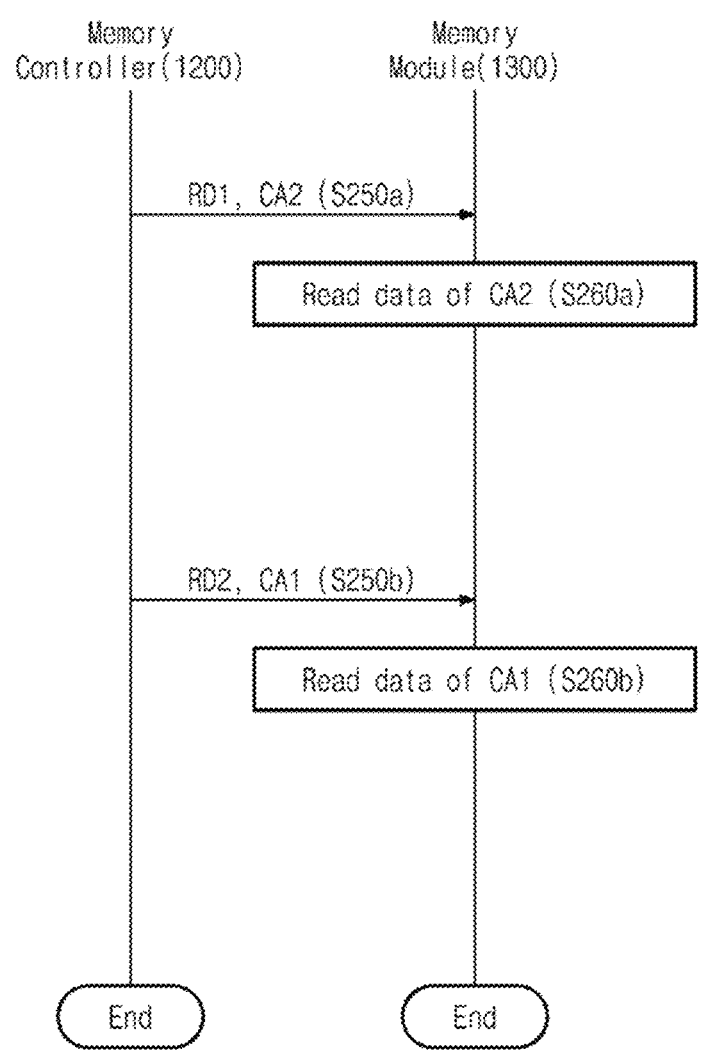
FIG. 4 is a diagram illustrating a flow of an external operation of a memory controller and a memory module in a first operation mode.

FIG. 4 is a diagram illustrating a flow of an external operation of the memory controller 1200 and the memory module 1300 in the first operation mode.

Referring to FIGS. 1 and 4, the memory controller 1200 may send the plurality of read commands RD and the plurality of column addresses CA to the memory module 1300. Each of operation S250a and operation S250b may correspond to operation S150 of FIG. 3. Each of operation S260a and operation S260b may correspond to operation S160 of FIG. 3.

In operation S250a, the memory module 1300 may receive a first read command RD1 and a second column address CA2 from the memory controller 1200. In operation S260a, the memory module 1300 may read data of memory cells corresponding to the second column address CA2.

In operation S250b, the memory module 1300 may receive a second read command RD2 and a first column address CA1 from the memory controller 1200. In operation S260b, the memory module 1300 may read data of memory cells corresponding to the first column address CA1.

Figure 5A:
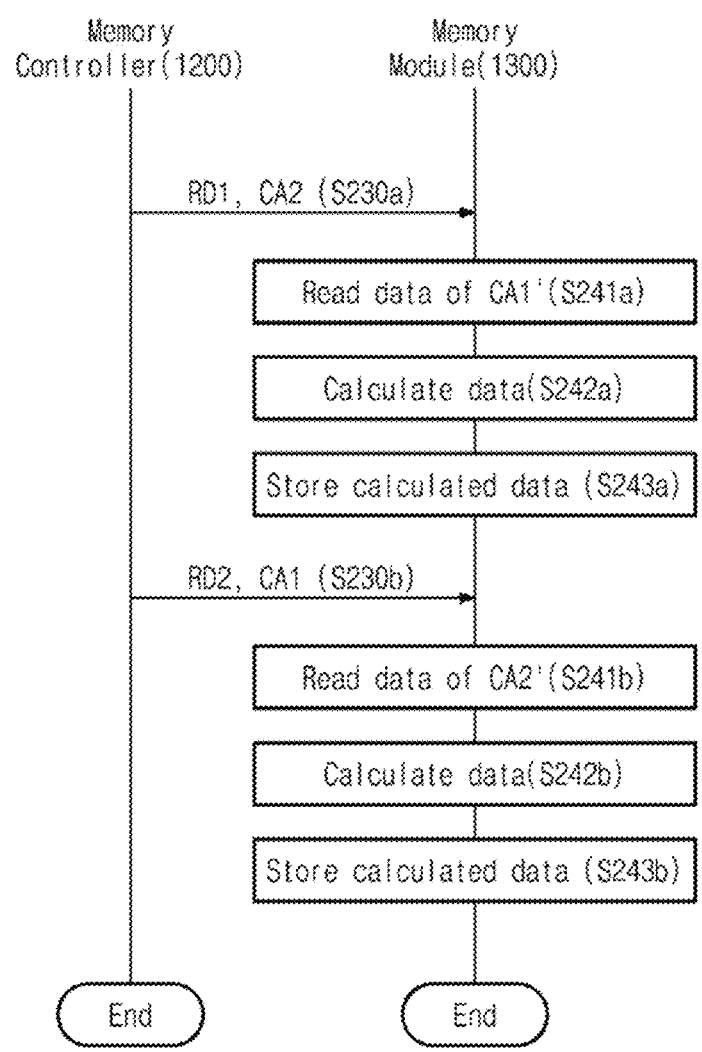
FIG. 5A is a diagram illustrating a flow of a first external operation of a memory controller and a memory module in a first operation mode.

FIG. 5A is a diagram illustrating a flow of a first external operation of the memory controller 1200 and the memory module 1300 in the second operation mode.

The first external operation may mean an operation in which the memory module 1300 reads data of memory cells corresponding to the PIM address, performs the PIM calculation, and stores a PIM calculation result.

Each of operation S230a and operation S230b may correspond to operation S130 of FIG. 3. Each of operation S241a, operation S241b, operation S242a, operation S242b, operation S243a, and operation S243b may correspond to operation S140 of FIG. 3.

Referring to FIGS. 1, 2, and 5A, the memory controller 1200 may send two read commands RD1 and RD2 and two column addresses CA1 and CA2 to the memory module 1300.

The burst length BL included in the PIM instruction set PIMIS may determine the number of PIM addresses that the memory module 1300 generates. An example in which the burst length BL is 2 and the memory module 1300 generates two PIM addresses CA1' and CA2' is illustrated in FIG. 5A.

The memory module 1300 may generate two PIM addresses (i.e., CA1' and then CA2') arranged regardless of two rearranged column addresses (i.e., CA2 and then CA1) that the memory controller 1200 sends. A relationship between the burst length BL and the number of PIM addresses will be described in detail below.

In operation S230a, the memory module 1300 may receive the first read command RD1 and the second column address CA2 from the memory controller 1200. In operation S241a, the memory module 1300 may read data of memory cells corresponding to the first PIM address CA1'.

In operation S242a, the memory module 1300 may perform a data calculation based on the data of the memory cells corresponding to the first PIM address CA1'.

In operation S243a, the memory module 1300 may store a data calculation result, that is, calculated data, in the PIM register file 224. In this case, the PIM command that the memory module 1300 executes may refer to a command for writing the data calculation result, that is, the calculated data, in the PIM register file 224.

In operation S230b, the memory module 1300 may receive the second read command RD2 and the first column address CA1 from the memory controller 1200. In operation S241b, the memory module 1300 may read data of memory cells corresponding to the second PIM address CA2'.

In operation S242b, the memory module 1300 may perform a data calculation based on the data of the memory cells corresponding to the second PIM address CA2'.

In operation S243b, the memory module 1300 may store a data calculation result, that is, calculated data, in the PIM register file 224.

Figure 5B:
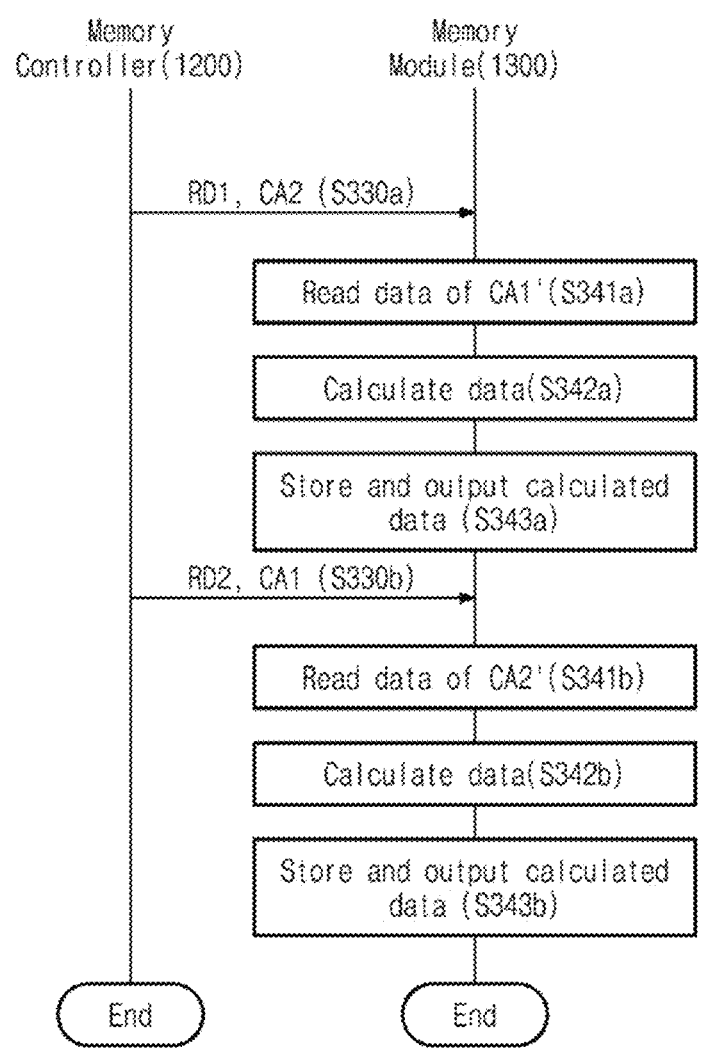
FIG. 5B is a diagram illustrating a flow of a second external operation of a memory controller and a memory module in a second operation mode.

FIG. 5B is a diagram illustrating a flow of a second external operation of the memory controller 1200 and the memory module 1300 in the second operation mode.

The second external operation may mean an operation in which the memory module 1300 reads data of memory cells corresponding to the PIM address, performs the PIM calculation, and stores and outputs a PIM calculation result.

Operation S330a, operation S330b, operation S341a, operation S341b, operation S342a, and operation S342b may respectively correspond to operation S230a, operation S230b, operation S241a, operation S241b, operation S242a, and operation S242b of FIG. 5A, and thus, additional description will be omitted to avoid redundancy.

Referring to FIGS. 1, 2, and 5B, when the memory module 1300 receives the first read command RD1 and the second column address CA2, the memory module 1300 may perform the data calculation; in operation S343a, the memory module 1300 may store the data calculation result, that is, the calculated data, in the PIM register file 224 and simultaneously may output the calculated data to the memory controller 1200.

When the memory module 1300 receives the second read command RD2 and the first column address CA1, the memory module 1300 may perform the data calculation; in operation S343b, the memory module 1300 may store the data calculation result, that is, the calculated data, in the PIM register file 224 and simultaneously may output the calculated data to the memory controller 1200.

Figure 6:
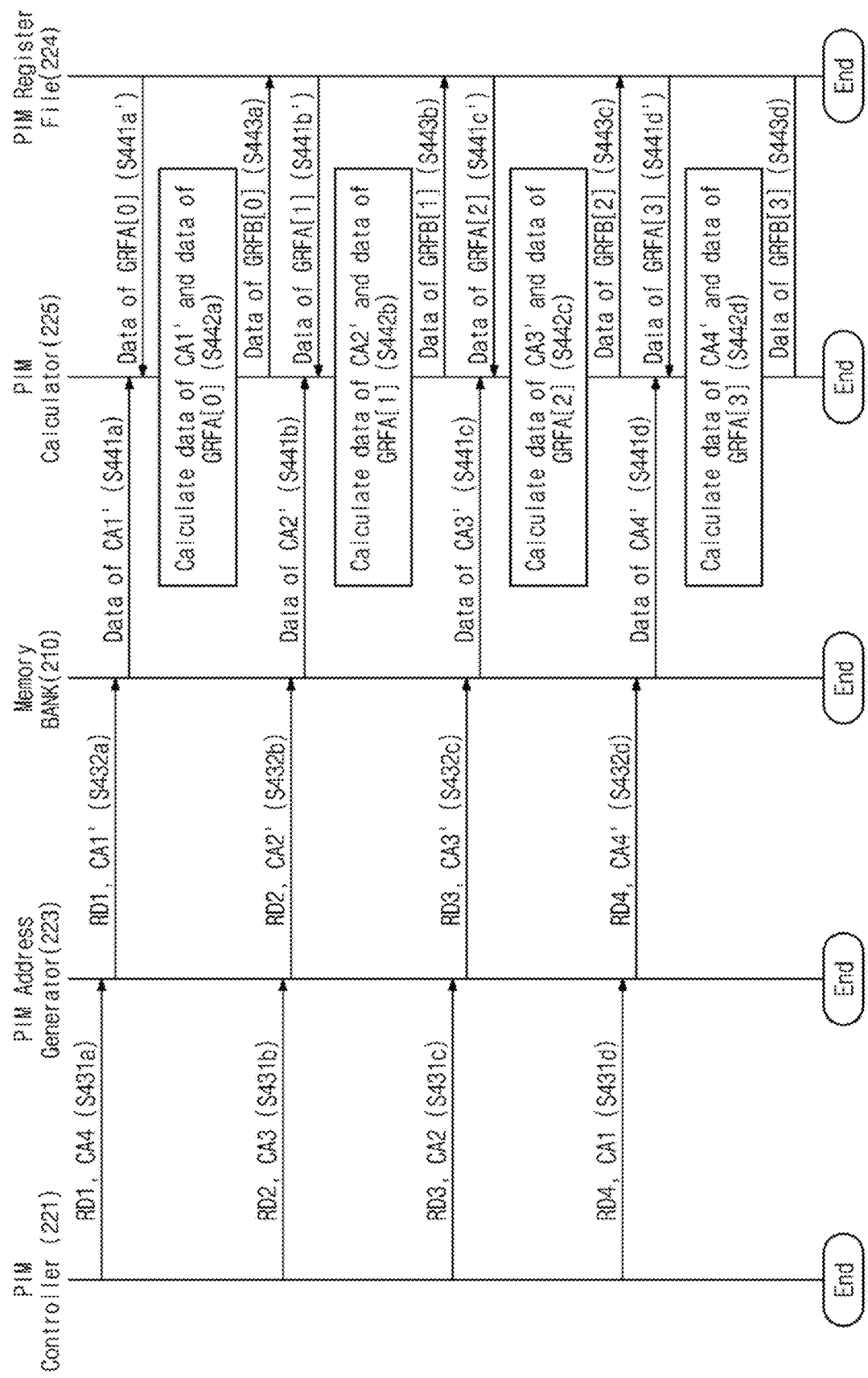
FIG. 6 is a diagram illustrating an internal operation flow of a memory device in a second operation mode.

FIG. 6 is a diagram illustrating an internal operation flow of the memory device 100/200 in the second operation mode. Additional description associated with the bank address BA and the row address RA will be omitted to avoid redundancy.

Referring to FIGS. 1, 2, and 6, the PIM address generator 223 may receive four read commands RD1 to RD4 and four column addresses CA1 to CA4 from the PIM controller 221.

In this case, the PIM controller 221 may receive the four column addresses CA1 to CA4 in the order rearranged by the memory controller 1200 and may send the four column addresses CA1 to CA4 to the PIM address generator 223.

In operation S431a, the PIM controller 221 may firstly receive the fourth column address CA4 and may send the fourth column address CA4 to the PIM address generator 223. In operation S431b, the PIM controller 221 may secondly receive the third column address CA3 and may send the third column address CA3 to the PIM address generator 223.

In operation S431c, the PIM controller 221 may thirdly receive the second column address CA2 and may send the second column address CA2 to the PIM address generator 223. In operation S431d, the PIM controller 221 may fourthly receive the first column address CA1 and may send the first column address CA1 to the PIM address generator 223.

In the second operation mode, the PIM command that the control logic 120/220 executes may include the plurality of read commands RD. The PIM command may include a read command (not illustrated) for the data data1 stored in the plurality of registers of the PIM register file 224. The PIM command may include a command (not illustrated) for writing a PIM register file in a plurality of registers.

When the PIM address generator 223 receives the first read command RD1 and the fourth column address CA4 from the PIM controller 221, in operation S432a, the PIM address generator 223 may generate a first PIM address CA1' regardless of at least some of address bits of the fourth column address CA4 and may send the first PIM address CA1' to the plurality of memory banks 210.

When the PIM address generator 223 receives the second read command RD2 and the third column address CA3 from the PIM controller 221, in operation S432b, the PIM address generator 223 may generate a second PIM address CA2' regardless of at least some of address bits of the third column address CA3 and may send the second PIM address CA2' to the plurality of memory banks 210.

When the PIM address generator 223 receives the third read command RD3 and the second column address CA2 from the PIM controller 221, in operation S432c, the PIM address generator 223 may generate a third PIM address CA3' regardless of at least some of address bits of the second column address CA2 and may send the third PIM address CA3' to the plurality of memory banks 210.

When the PIM address generator 223 receives the fourth read command RD4 and the first column address CA1 from the PIM controller 221, in operation S432d, the PIM address generator 223 may generate a fourth PIM address CA4' regardless of at least some of address bits of the first column address CA1 and may send the fourth PIM address CA4' to the plurality of memory banks 210.

The PIM register file 224 may include a plurality of registers configured to store the plurality of data data1 and data2. Among the plurality of registers, four registers GRFA[0], GRFA[1], GRFA[2], and GRFA[3] including the data data1 before the PIM calculation and four registers GRFB[0], GRFB[1], GRFB[2], and GRFB[3] including the data data2 after the PIM calculation will be described with reference to FIG. 6.

In operation S441a, data (data of CA1') of memory cells corresponding to the first PIM address CA1' may be sent to the PIM calculator 225 under control of the control logic 120/220. In operation S441a', first register data (data of GRFA[0]) of the PIM register file 224 corresponding to the first PIM address CA1' may be sent to the PIM calculator 225 under control of the control logic 120/220.

In operation S442a, the PIM calculator 225 may perform data calculation based on the data (data of CA1') of the memory cells corresponding to the first PIM address CA1' and the first register data (data of GRFA[0]) of the PIM register file 224 corresponding to the first PIM address CA1'.

In operation S441b, data (data of CA2') of memory cells corresponding to the second PIM address CA2' may be sent to the PIM calculator 225 under control of the control logic 120/220. In operation S441b', second register data (data of GRFA[1]) of the PIM register file 224 corresponding to the second PIM address CA2' may be sent to the PIM calculator 225 under control of the control logic 120/220.

In operation S442b, the PIM calculator 225 may perform data calculation based on the data (data of CA2') of the memory cells of the memory bank corresponding to the second PIM address CA2' and the second register data (data of GRFA[1]) of the PIM register file 224 corresponding to the second PIM address CA2'.

In operation S441c, data (data of CA3') of memory cells corresponding to the third PIM address CA3' may be sent to the PIM calculator 225 under control of the control logic 120/220. In operation S441c', third register data (data of GRFA[2]) of the PIM register file 224 corresponding to the third PIM address CA3' may be sent to the PIM calculator 225 under control of the control logic 120/220.

In operation S442c, the PIM calculator 225 may perform data calculation based on the data (data of CA3') of the memory cells of the memory bank corresponding to the third PIM address CA3' and the third register data (data of GRFA[2]) of the PIM register file 224 corresponding to the third PIM address CA3'.

In operation S441d, data (data of CA4') of memory cells corresponding to the fourth PIM address CA4' may be sent to the PIM calculator 225 under control of the control logic 120/220. In operation S441d', fourth register data (data of GRFA[3]) of the PIM register file 224 corresponding to the fourth PIM address CA4' may be sent to the PIM calculator 225 under control of the control logic 120/220.

In operation S442d, the PIM calculator 225 may perform data calculation based on the data (data of CA4') of the memory cells of the memory bank corresponding to the fourth PIM address CA4' and the fourth register data (data of GRFA[3]) of the PIM register file 224 corresponding to the fourth PIM address CA4'.

In operation S443a, the control logic 120/220 may control the PIM register file 224 such that a first data calculation result (data of GRFB[0]) is written in the PIM register file 224. Alternatively, although not illustrated, the control logic 120/220 may control the PIM register file 224 such that the first data calculation result (data of GRFB[0]) is stored and simultaneously may be output to the memory controller 1200 through the buffer block 140/240.

In operation S443b, the control logic 120/220 may control the PIM register file 224 such that a second data calculation result (data of GRFB[1]) is written in the PIM register file 224. Alternatively, although not illustrated, the control logic 120/220 may control the PIM register file 224 such that the second data calculation result (data of GRFB[1]) is stored and simultaneously may be output to the memory controller 1200 through the buffer block 140/240.

In operation S443c, the control logic 120/220 may control the PIM register file 224 such that a third data calculation result (data of GRFB[2]) is written in the PIM register file 224. Alternatively, although not illustrated, the control logic 120/220 may control the PIM register file 224 such that the third data calculation result (data of GRFB[2]) is stored and simultaneously may be output to the memory controller 1200 through the buffer block 140/240.

In operation S443d, the control logic 120/220 may control the PIM register file 224 such that a fourth data calculation result (data of GRFB[3]) is written in the PIM register file 224. Alternatively, although not illustrated, the control logic 120/220 may control the PIM register file 224 such that the fourth data calculation result (data of GRFB[3]) is stored and simultaneously may be output to the memory controller 1200 through the buffer block 140/240.

Figure 7A:
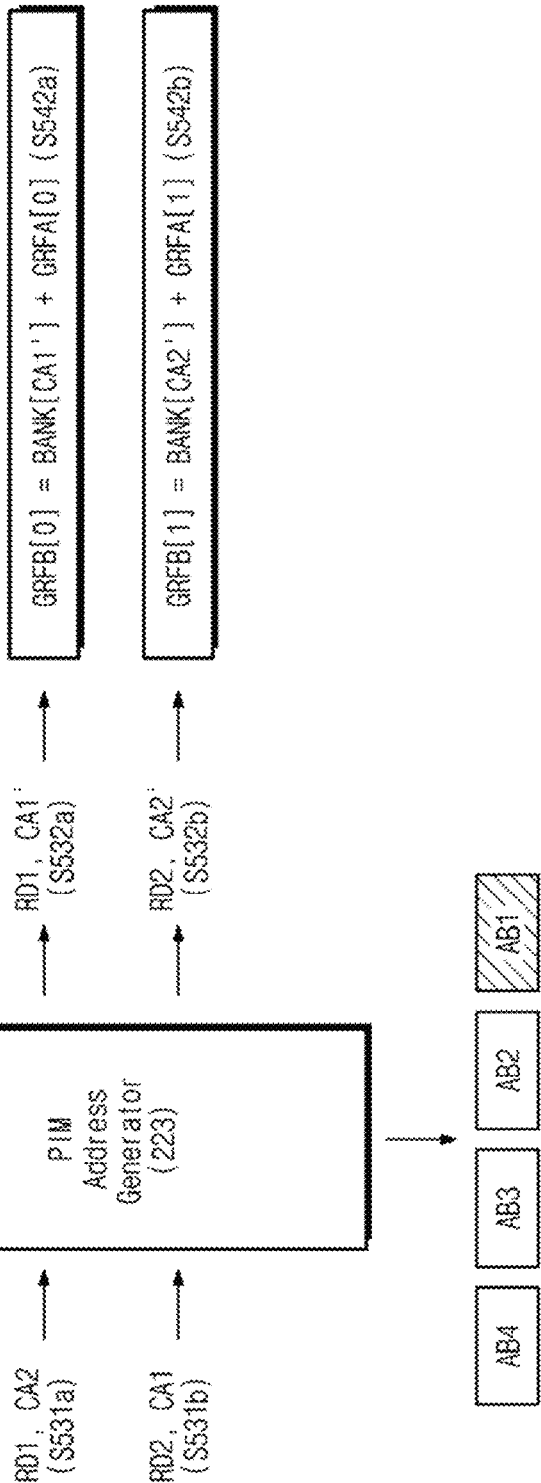
FIG. 7A is a diagram illustrating a first embodiment of a PIM calculation in a second operation mode when a burst length included in a PIM instruction set is 2.

FIG. 7A is a diagram illustrating a first embodiment of a PIM calculation in the second operation mode when the burst length BL included in the PIM instruction set PIMIS is 2. The PIM instruction set PIMIS may include information about an operator, registers of the PIM register file 224, and the burst length BL.

Operation S531a, operation S531b, operation S532a, and operation S532b are similar to operation S431a, operation S431b, operation S432a, and operation S432b of FIG. 6, and thus, additional description will be omitted to avoid redundancy.

The operator included in the PIM instruction set PIMIS may be at least one of addition, subtraction, multiplication, and division. The PIM instruction set PIMIS may include a multiplication and accumulation (MAC) operation. Below, the description will be given under the assumption that the operator indicates addition.

The burst length BL included in the PIM instruction set PIMIS may determine the number of some column address bits for generating a plurality of PIM addresses. For example, when the burst length BL is $2^k$, the number of some column address bits may be "k". In this case, the PIM address generator 223 may generate $2^k$ PIM addresses.

Values of some column address bits may be determined regardless of column address bits that the PIM controller 221 receives from the memory controller 1200.

Some column address bits may be some of column address bits of a column address that the PIM address generator 223 receives from the PIM controller 221. Values of the remaining column address bits other than some column address bits of the column address that the memory controller 1200 sends may be fixed.

In FIG. 7A, the PIM address generator 223 may receive two read commands RD1 and RD2 and two column addresses CA1 and CA2 from the PIM controller 221.

In FIG. 7A, one column address CA1 or CA2 may include a plurality of column address bits AB4, AB3, AB2, and AB1. An address value of one column address CA1 or CA2 may be determined by the plurality of column address bits.

For example, when the burst length BL included in the PIM instruction set PIMIS is 2, the number of some column address bits for generating the PIM address may be 1 (e.g., AB1 having a value of 0 or 1). In this case, the PIM address generator 223 may generate two PIM addresses CA1' and CA2'.

The first PIM address CA1' that the PIM address generator 223 generates may include the column address bit AB1 having a value of 0. Values of the remaining column address bits AB4, AB3, and AB2 may be fixed. Accordingly, the first PIM address CA1' may be a least significant bit (LSB) address regardless of the remaining column address bits AB4, AB3, and AB2.

The second PIM address CA2' that the PIM address generator 223 generates may include the column address bit AB1 having a value of 1. Values of the remaining column address bits AB4, AB3, and AB2 may be fixed. Accordingly, the second PIM address CA2' may be a second LSB address (e.g., a most significant bit (MSB) address) following the first PIM address CA1' regardless of the remaining column address bits AB4, AB3, and AB2.

In FIG. 7A, S542a may represent a calculation equation in which a data calculation (i.e., a PIM calculation) is performed by the PIM command including the first read command RD1.

In FIG. 7A, GRFB[0] may represent a first register in which a first data calculation result is stored, BANK[CA1'] may represent memory cells of a memory bank, in which data read based on the first read command RD1 and the first PIM address CA1' are stored, and GRFA[0] may represent the first register of the PIM register file 224 that stores data before calculation, which are read based on the first PIM address CA1'.

In FIG. 7A, S542a may represent that a result obtained by adding the data BANK[CA1'] of the memory cells and the data of the first register GRFA[0] is stored in the first register GRFA[0] of the PIM register file 224 as the first data calculation result.

In FIG. 7A, S542b may represent a calculation equation in which a data calculation (i.e., a PIM calculation) is performed by the PIM command including the second read command RD2.

In FIG. 7A, GRFB[1] may represent a second register in which a second data calculation result is stored, BANK [CA2'] may represent memory cells of a memory bank, in which data read based on the second read command RD2 and the second PIM address CA2' are stored, and GRFA[1] may represent the second register of the PIM register file 224 that stores data before calculation, which are read based on the second PIM address CA2'.

In FIG. 7A, S542b may represent that a result obtained by adding the data BANK[CA2'] of the memory cells and the data of the second register GRFA[1] is stored in the second register GRFA[1] of the PIM register file 224 as the second data calculation result.

Figure 7B:
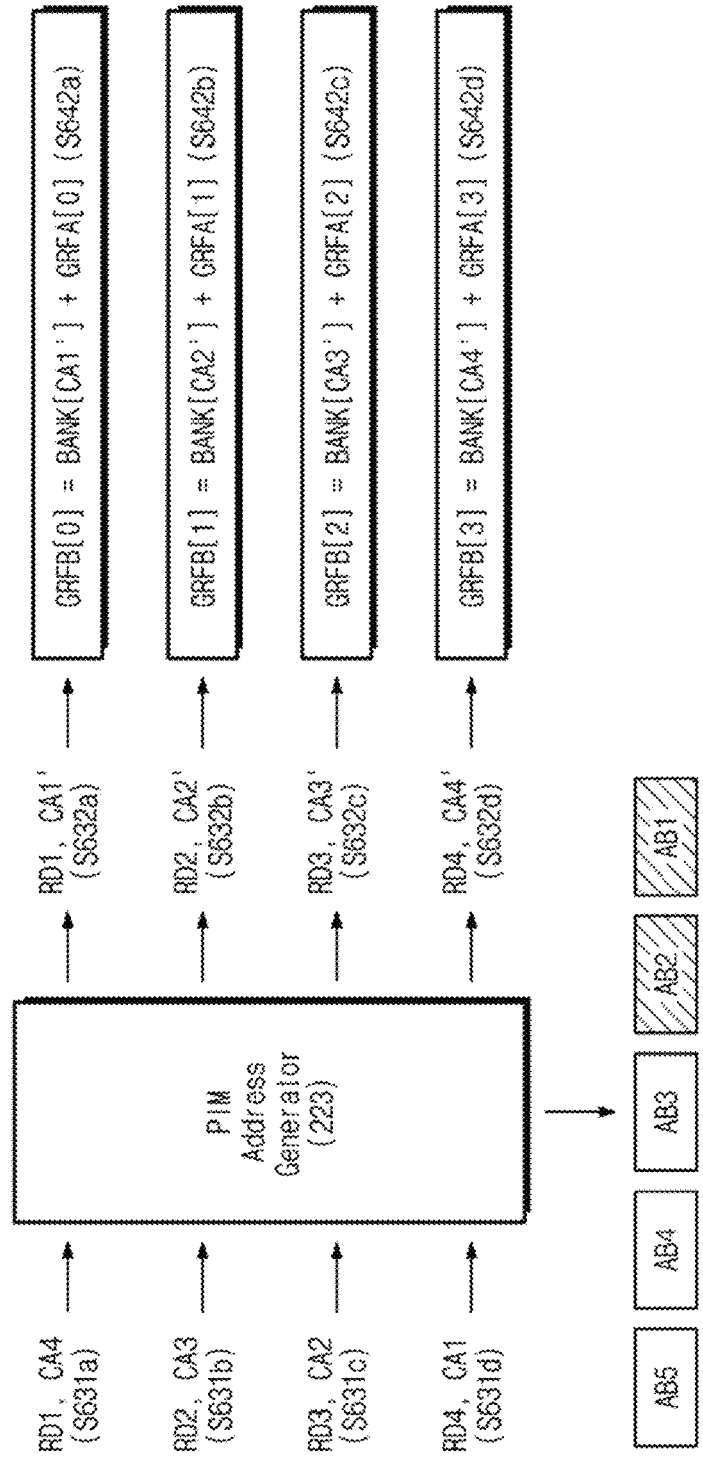
FIG. 7B is a diagram illustrating a second embodiment of a PIM calculation in a second operation mode when a burst length included in a PIM instruction set is 4.

FIG. 7B is a diagram illustrating a second embodiment of a PIM calculation in the second operation mode when the burst length BL included in the PIM instruction set PIMIS is 4. Operation S631a, operation S631b, operation S631c, operation S631d, operation S632a, operation S632b, operation S632c, and operation S632d may respectively correspond to operation S431a, operation S431b, operation S431c, operation S431d, operation S432a, operation S432b, operation S432c, and operation S432d of FIG. 6, and thus, additional description will be omitted to avoid redundancy.

In FIG. 7B, the PIM address generator 223 may receive four read commands RD1 to RD4 and four column addresses CA1 to CA4 from the PIM controller 221.

In FIG. 7B, one column address (e.g., one of CA1 to CA4) may include a plurality of column address bits AB5, AB4, AB3, AB2, and AB1. An address value of one column address (e.g., one of CA1 to CA4) may be determined by a plurality of column address bits.

For example, when the burst length BL included in the PIM instruction set PIMIS is 4, the number of some column address bits for generating the PIM address may be 2 (e.g., AB2 and AB1 having one of 00, 01, 10, and 11). In this case, the PIM address generator 223 may generate four PIM addresses CA1' to CA4'.

The first PIM address CA1' that the PIM address generator 223 generates may include the column address bits AB2 and AB1 having a value of 00. Values of the remaining column address bits AB5, AB4, and AB3 may be fixed. Accordingly, the first PIM address CA1' may be an LSB address regardless of the remaining column address bits AB5, AB4, and AB3.

The second PIM address CA2' that the PIM address generator 223 generates may include the column address bits AB2 and AB1 having a value of 01. Values of the remaining column address bits AB5, AB4, and AB3 may be fixed. Accordingly, the second PIM address CA2' may be a second LSB address following the first PIM address CA1' regardless of the remaining column address bits AB5, AB4, and AB3.

The third PIM address CA3' that the PIM address generator 223 generates may include the column address bits AB2 and AB1 having a value of 10. Values of the remaining column address bits AB5, AB4, and AB3 may be fixed. Accordingly, the third PIM address CA3' may be a third LSB address following the second PIM address CA2' regardless of the remaining column address bits AB5, AB4, and AB3.

The fourth PIM address CA4' that the PIM address generator 223 generates may include the column address bits AB2 and AB1 having a value of 11. Values of the remaining column address bits AB5, AB4, and AB3 may be fixed. Accordingly, the fourth PIM address CA4' may be a fourth LSB address (e.g., an MSB address) following the third PIM address CA3' regardless of the remaining column address bits AB5, AB4, and AB3.

In FIG. 7B, S642a may represent a calculation equation in which a data calculation (i.e., a PIM calculation) is performed by the PIM command including the first read command RD1.

In FIG. 7B, GRFB[0] may represent a first register in which a first data calculation result is stored, BANK[CA1'] may represent memory cells of a memory bank, in which data read based on the first read command RD1 and the first PIM address CA1' are stored, and GRFA[0] may represent the first register of the PIM register file 224 that stores data before calculation, which are read based on the first PIM address CA1'.

In FIG. 7B, S642a may represent that a result obtained by adding the data BANK[CA1'] of the memory cells and the data of the first register GRFA[0] is stored in the first register GRFB[0] of the PIM register file 224 as the first data calculation result.

In FIG. 7B, S642b may represent a calculation equation in which a data calculation (i.e., a PIM calculation) is performed by the PIM command including the second read command RD2.

In FIG. 7B, GRFB[1] may represent a second register in which a second data calculation result is stored, BANK[CA2'] may represent memory cells of a memory bank, in which data read based on the second read command RD2 and the second PIM address CA2' are stored, and GRFA[1] may represent the second register of the PIM register file 224 that stores data before calculation, which are read based on the second PIM address CA2'.

In FIG. 7B, S642b may represent that a result obtained by adding the data BANK[CA2'] of the memory cells and the data of the second register GRFA[1] is stored in the second register GRFB[1] of the PIM register file 224 as the second data calculation result.

In FIG. 7B, S642c may represent a calculation equation in which a data calculation (i.e., a PIM calculation) is performed by the PIM command including the third read command RD3.

In FIG. 7B, GRFB[2] may represent a third register in which a third data calculation result is stored, BANK[CA3'] may represent memory cells of a memory bank, in which data read based on the third read command RD3 and the third PIM address CA3' are stored, and GRFA[2] may represent the third register of the PIM register file 224 that stores data before calculation, which are read based on the third PIM address CA3'.

In FIG. 7B, S642c may represent that a result obtained by adding the data BANK[CA3'] of the memory cells and the data of the third register GRFA[2] is stored in the third register GRFB[2] of the PIM register file 224 as the third data calculation result.

In FIG. 7B, S642d may represent a calculation equation in which a data calculation (i.e., a PIM calculation) is performed by the PIM command including the fourth read command RD4.

In FIG. 7B, GRFB[3] may represent a fourth register in which a fourth data calculation result is stored, BANK[CA4'] may represent memory cells of a memory bank, in which data read based on the fourth read command RD4 and the fourth PIM address CA4' are stored, and GRFA[3] may represent the fourth register of the PIM register file 224 that stores data before calculation, which are read based on the fourth PIM address CA4'.

In FIG. 7B, S642d may represent that a result obtained by adding the data BANK[CA4'] of the memory cells and the data of the fourth register GRFA[3] is stored in the fourth register GRFB[3] of the PIM register file 224 as the fourth data calculation result.

In FIG. 7B, S642a to S642d may be independently performed whenever the PIM address generator 223 receives one read command and one column address from the PIM controller 221.

An example in which the number of column address bits is 4 is illustrated in FIG. 7A, and an example in which the number of column address bits is 5 is illustrated in FIG. 7B. However, the column address may include 5 or more column address bits or may include 6 or more column address bits.

A configuration in which the PIM address generator 223 receives 2 read commands and 2 column address is illustrated in FIG. 7A, and a configuration in which the PIM address generator 223 receives 4 read commands and 4 column address is illustrated in FIG. 7B. However, the PIM address generator 223 may receive more read commands and more column addresses from the PIM controller 221.

A configuration in which the burst length BL is 2 is illustrated in FIG. 7A, and a configuration in which the burst length BL is 4 is illustrated in FIG. 7B. However, the burst length BL may have a value exceeding 4. In this case, there may be changed the number of some column address bits, which are used to generate the PIM address, from among a plurality of column address bits of a column address that the PIM address generator 223 receives from the PIM controller 221.

Figure 8:
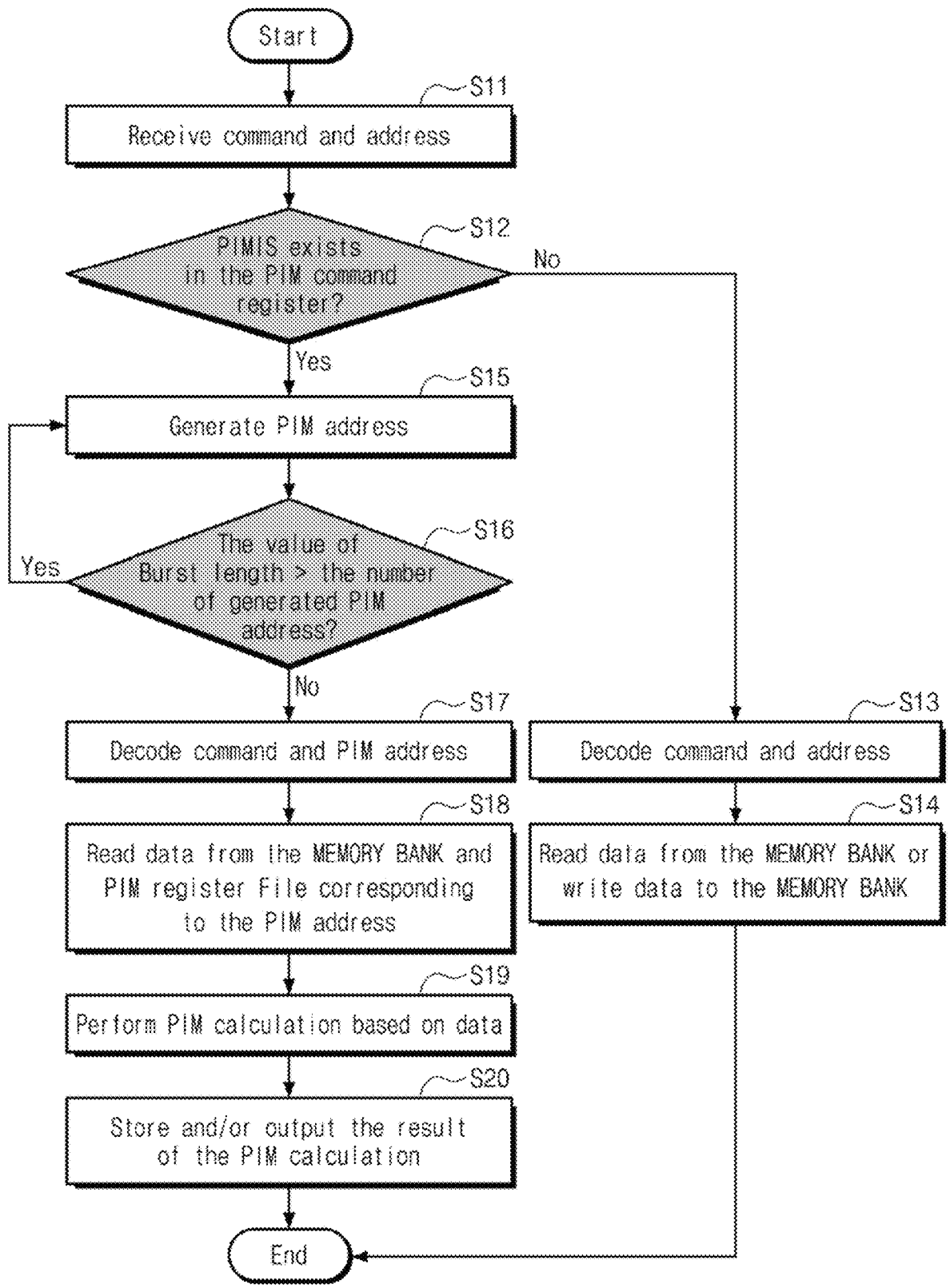
FIG. 8 is a flowchart illustrating an operating method of a memory device according to an example embodiment.

FIG. 8 is a flowchart illustrating an operating method of the memory device 100/200 according to an example embodiment.

Referring to FIGS. 1, 2, and 8, in operation S11, the control logic 120/220 may receive the command CMD and the addresses BA, RA, and CA from the memory controller 1200.

In operation S12, the control logic 120/220 may determine whether the PIM instruction set PIMIS is present in the PIM command register 222. As described above, the PIM instruction set PIMIS may be received from the memory controller 1200 before the control logic 120/220 receives the command CMD and the addresses BA, RA, and CA from the memory controller 1200.

When it is determined that the PIM instruction set PIMIS is absent from the PIM command register 222, the control logic 120/220 may allow the memory device 100/200 to enter the first operation mode. In this case, operation S13 and operation S14 may be performed.

In operation S13, the row decoder 112 and the column decoder 114 may decode the command CMD and the addresses BA, RA, and CA. The control logic 120/220 may receive the command CMD from the memory controller 1200 and control the row decoder 112 and the column decoder 114 based on the command CMD. In operation S14, the sense amplifier and write driver 113 may read data from memory cells of a memory bank or may write data in the memory cells of the memory bank.

When it is determined that the PIM instruction set PIMIS is present in the PIM command register 222, the control logic 120/220 may allow the memory device 100/200 to enter the second operation mode. When the memory device 100/200 enters the second operation mode, the PIM calculator 225 may perform the PIM calculation. In this case, operation S15 to the operation S20 may be performed.

In operation S15 and operation S16, the number of PIM addresses may be determined based on a value of the burst length BL included in the PIM instruction set PIMIS. Accordingly, when the value of the burst length BL is greater than the number of PIM addresses to be generated, the PIM address generator 223 may generate one PIM address whenever one read command and one column address are received from the PIM controller 221.

In operation S17, the column decoder 114 may decode the generated PIM address and the read command. The column decoder 114 may select one or more bit lines of the plurality of bit lines BLs based on the PIM address CA' that the control logic 120/220 sends.

In operation S18, the memory device 100/200 may read data of memory cells of a memory bank corresponding to the PIM address CA'. The memory device 100/200 may read data of a register of the PIM register file 224 corresponding to the PIM address CA' thus generated.

In operation S19, the PIM calculator 225 may perform the PIM calculation based on the data of the memory cells and the data of the register. Whenever the PIM address generator 223 generates one PIM address, the PIM calculator 225 may perform the PIM calculation based on data of memory cells and data of a register.

In operation S20, the control logic 120/220 may store a PIM calculation result in a register of the PIM register file 224. In this case, whenever a result of one PIM calculation is generated, the PIM register file 224 may store the PIM calculation result in one register.

Alternatively, the control logic 120/220 may control the PIM register file 224 such that the PIM calculation result is stored in the PIM register file 224 and simultaneously such that the PIM calculation result is output to the memory controller 1200. In this case, the PIM register file 224 may store the PIM calculation result and simultaneously may output the PIM calculation result to the memory controller 1200 through the buffer block 140/240.

According to an example embodiment, a memory device for a PIM calculation, a memory module including the memory device, and an operating method of the memory device may automatically generate an address for accessing memory cells within the memory device. Accordingly, the memory device may accordingly execute desired calculations in order, based on commands and addresses that a memory controller provides.

By way of summation and review, for a random access memory to perform some calculations, a central processing unit may send a command and an address to the random access memory. However, a memory controller may rearrange commands and addresses that the central processing unit sends in order. The memory controller may send the rearranged commands and addresses to the random access memory. In this case, the random access memory may be incapable of performing calculations in the order that the central processing unit specifies.

As described above, embodiments may provide a memory device performing PIM calculations depending on an original order even though orders of PIM calculation commands are rearranged, a memory module including the same, and an operating method of the memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
   a plurality of memory banks, each of the plurality of memory banks including:
      a memory cell array including a plurality of memory cells connected with a plurality of word lines;
      a row decoder connected with the memory cell array through the plurality of word lines;
      a sense amplifier and write driver connected with the memory cell array through a plurality of bit lines;
      a column decoder connected with the sense amplifier and write driver; and
      control logic configured to receive a plurality of column address bits and a plurality of read commands,
   wherein the control logic includes a processing-in-memory (PIM) address generator,
   wherein, in a first operation mode, the control logic sends the plurality of column address bits to a memory bank of the plurality of memory banks, and
   wherein, in a second operation mode, when the PIM address generator receives a first read command of the plurality of read commands, the control logic sends, to the memory bank, a first PIM address generated based on remaining column address bits other than some column address bits of the plurality of column address bits.

2. The memory device as claimed in claim 1, wherein the control logic further includes:
   a PIM register file including a plurality of registers configured to store a plurality of data; and
   a PIM calculator configured to perform a PIM calculation based on data of a register corresponding to the first PIM address from among the plurality of registers of the PIM register file and data of memory cells corresponding to the first PIM address.

3. The memory device as claimed in claim 2, wherein the control logic further includes:
   a PIM command register configured to store a PIM instruction set including information about an operator, the plurality of registers of the PIM register file, and a burst length.

4. The memory device as claimed in claim 3, wherein the control logic determines whether the PIM instruction set is present in the PIM command register, and wherein, when it is determined that the PIM instruction set is present in the PIM command register, the control logic determines entering the second operation mode in response to the PIM instruction set.

5. The memory device as claimed in claim 4, wherein the control logic determines entering the first operation mode in response to determining that the PIM instruction set is absent from the PIM command register.

6. The memory device as claimed in claim 3, wherein, in the second operation mode, each of a plurality of PIM addresses that the PIM address generator generates is based on the burst length included in the PIM instruction set.

7. The memory device as claimed in claim 3, wherein, in the second operation mode, a number of PIM addresses that the PIM address generator generates is determined based on the burst length included in the PIM instruction set.

8. The memory device as claimed in claim 1, wherein, in the second operation mode, when the PIM address generator receives a second read command of the plurality of read commands, the control logic sends, to the memory bank, a second PIM address generated based on the remaining column address bits other than the some column address bits of the plurality of column address bits.

9. The memory device as claimed in claim 8, wherein the first PIM address is an LSB address of a plurality of PIM addresses generated based on the remaining column address bits, and
wherein the second PIM address is a second LSB address following the first PIM address.

10. An operating method of a memory device for a processing-in-memory (PIM) calculation, which includes a plurality of memory banks each including a plurality of memory cells, the method comprising:
receiving, at control logic, a plurality of column address bits and a plurality of read commands from a memory controller;
sending, at the control logic, the plurality of column address bits to a memory bank of the plurality of memory banks in a first operation mode; and
when a PIM address generator receives a first read command of the plurality of read commands, sending, at the control logic, to the memory bank, a first PIM address generated based on remaining column address bits other than some column address bits of the plurality of column address bits in a second operation mode.

11. The method as claimed in claim 10, further comprising:
performing, at a PIM calculator, the PIM calculation based on data of a register of a PIM register file corresponding to the first PIM address and data of memory cells corresponding to the first PIM address.

12. The method as claimed in claim 11, further comprising, before the control logic receives the plurality of column address bits and the plurality of read commands from the memory controller:
receiving and storing, at a PIM command register included in the control logic, a PIM instruction set including information about an operator, a plurality of registers of the PIM register file, and a burst length from the memory controller.

13. The method as claimed in claim 12, further comprising:
when the PIM instruction set is present in the PIM command register, determining, at the control logic, entering the second operation mode in response to the PIM instruction set.

14. The method as claimed in claim 13, further comprising:
determining, at the control logic, entering the first operation mode in response to determining that the PIM instruction set is absent from the PIM command register.

15. The method as claimed in claim 12, wherein, in the second operation mode, the control logic allows the PIM address generator to generate a plurality of PIM addresses based on the burst length included in the PIM instruction set.

16. The method as claimed in claim 12, wherein, in the second operation mode, the control logic determines a number of PIM addresses, which the PIM address generator generates, based on the burst length included in the PIM instruction set.

17. The method as claimed in claim 10, wherein, in the second operation mode, when the PIM address generator receives a second read command of the plurality of read commands, the control logic sends, to the memory bank, a second PIM address generated based on the remaining column address bits other than the some column address bits of the plurality of column address bits.

18. A memory module, comprising:
a plurality of memory devices,
wherein the plurality of memory devices receive a command and an address from an external host through a memory controller,
wherein each of the plurality of memory devices includes a plurality of memory banks, each of the plurality of memory banks including:
a memory cell array including a plurality of memory cells connected with a plurality of word lines;
a row decoder connected with the memory cell array through the plurality of word lines;
a sense of amplifier and write driver connected with the memory cell array through a plurality of bit lines;
a column decoder connected with the sense amplifier and write driver; and
control logic configured to receive a plurality of column address bits and a plurality of read commands,
wherein the control logic includes a processing-in-memory (PIM) address generator,
wherein, in a first operation mode, the control logic sends the plurality of column address bits to a memory bank of the plurality of memory banks, and
wherein, in a second operation mode, when the PIM address generator receives a first read command of the plurality of read commands, the control logic sends, to the memory bank, a first PIM address generated based on remaining column address bits other than some column address bits of the plurality of column address bits.

19. The memory module as claimed in claim 18, wherein the control logic further includes:
a PIM command register configured to store a PIM instruction set including an information about an operator, a plurality of registers of a PIM register file, and a burst length, and
wherein the control logic allows the plurality of memory devices to enter one of the first operation mode or the second operation mode, depending on whether the PIM instruction set is present in the PIM command register.

20. The memory device as claimed in claim 1, wherein:
the control logic includes a register configured to store a PIM instruction set, the PIM instruction set including a burst length, a number of the remaining column address bits for generating the first PIM address is based on the burst length, and respective values of the other than some column address bits of the plurality of column address bits are fixed.

* * * * *